(12) United States Patent
Huai et al.

(10) Patent No.: US 7,161,829 B2
(45) Date of Patent: Jan. 9, 2007

(54) CURRENT CONFINED PASS LAYER FOR MAGNETIC ELEMENTS UTILIZING SPIN-TRANSFER AND AN MRAM DEVICE USING SUCH MAGNETIC ELEMENTS

(75) Inventors: Yiming Huai, Pleasanton, CA (US); Paul P. Nguyen, San Jose, CA (US); Frank Albert, Redwood City, CA (US)

(73) Assignee: Grandis, Inc., Milpitas, CA (US)

( * ) Notice: Subject to any disclaimer, the term of this patent is extended or adjusted under 35 U.S.C. 154(b) by 80 days.

(21) Appl. No.: 10/665,945

(22) Filed: Sep. 19, 2003

(65) Prior Publication Data

US 2005/0063222 A1   Mar. 24, 2005

(51) Int. Cl.
G11C 11/00 (2006.01)
G11C 7/00 (2006.01)
(52) U.S. Cl. .................. 365/158; 365/171; 365/173
(58) Field of Classification Search ............. 365/158, 365/171, 173, 324.1
See application file for complete search history.

(56) References Cited

U.S. PATENT DOCUMENTS

| 6,532,164 | B1 | 3/2003 | Redon et al. |
| 6,560,077 | B1 | 5/2003 | Fujiwara et al. |
| 6,738,237 | B1* | 5/2004 | Gill .................. 360/324.11 |
| 6,865,109 | B1* | 3/2005 | Covington ............... 365/173 |
| 2002/0105827 | A1 | 8/2002 | Redon et al. |
| 2003/0007398 | A1 | 1/2003 | Daughton et al. |
| 2003/0059588 | A1 | 3/2003 | Hannah et al. |
| 2003/0123200 | A1* | 7/2003 | Nagasaka et al. ........ 360/324.1 |
| 2005/0002126 | A1* | 1/2005 | Fujiwara et al. ........ 360/324.1 |

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809-3811.

J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

(Continued)

Primary Examiner—Son T. Dinh
(74) Attorney, Agent, or Firm—Sawyer Law Group LLP

(57) ABSTRACT

A method and system for providing and magnetic element is disclosed. In one aspect, the magnetic element includes at least a pinned layer, a free layer, and a current confined layer residing between the pinned layer and the free layer. The pinned layer is ferromagnetic and has a first magnetization. The current confined layer has at least one channel in an insulating matrix. The channel(s) are conductive and extend through the current confined layer. The free layer is ferromagnetic and has a second magnetization. The pinned layer, the free layer, and the current confined layer are configured to allow the magnetization of the free layer to be switched using spin transfer. The magnetic element may also include other layers, including layers for spin valve(s), spin tunneling junction(s), dual spin valve(s), dual spin tunneling junction(s), and dual spin valve/tunnel structure(s).

34 Claims, 11 Drawing Sheets

OTHER PUBLICATIONS

J.C. Slonczewski, "Current-Driven Excitation of Magnetic Multilayers", Journal of Magnetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

L. Berger, *Emission of spin waves by a magnetic multilayer traversed by a current*, Physical Review B, vol. 54, No. 13, Oct. 1996, pp. 9353-9358.

* cited by examiner

CURRENT CONFINED PASS LAYER FOR MAGNETIC ELEMENTS UTILIZING SPIN-TRANSFER AND AN MRAM DEVICE USING SUCH MAGNETIC ELEMENTS

FIELD OF THE INVENTION

The present invention relates to magnetic memory systems, and more particularly to a method and system for providing an element that employs a spin transfer effect in switching and that can be used in a magnetic memory such as magnetic random access memory ("MRAM").

BACKGROUND OF THE INVENTION

FIGS. 1A and 1B depict conventional magnetic elements 10 and 10'. The conventional magnetic element 1 is a spin valve 10 and includes a conventional antiferromagnetic (AFM) layer 12, a conventional pinned layer 14, a conventional nonmagnetic spacer layer 16 and a conventional free layer 18. The conventional pinned layer 14 and the conventional free layer 18 are ferromagnetic. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' and a conventional free layer 18'. The conventional barrier layer 16' is thin enough for electrons to tunnel through in a conventional spin tunneling junction 10'.

Depending upon the orientations of the magnetizations of the conventional free layer 18/18' and the conventional pinned layer 14/14', respectively, the resistance of the conventional magnetic element 10/10', respectively, changes. When the magnetizations of the conventional free layer 18/18' and conventional pinned layer 14/14' are parallel, the resistance of the conventional magnetic element /10'10 is low. When the magnetizations of the conventional free layer 18/18' and the conventional pinned layer 14/14' are antiparallel, the resistance of the conventional magnetic element 10/10' is high.

To sense the resistance of the conventional magnetic element 10/10', current is driven through the conventional magnetic element 10/10'. Current can be driven in one of two configurations, current in plane ("CIP") and current perpendicular to the plane ("CPP"). In the CPP configuration, current is driven perpendicular to the layers of conventional magnetic element 10/10' (up or down as seen in FIG. 1A or 1B).

One of ordinary skill in the art will readily recognize that the conventional magnetic elements 10 and 10' may not function at higher memory cell densities. The conventional magnetic elements 10 and 10' are typically written using an external magnetic field generated using current driven by components outside of the magnetic elements 10 and 10'. The magnetic field required to switch the magnetization of the free layer 18 or 18' (switching field) is inversely proportional to the width of the conventional magnetic element 10 or 10', respectively. Because the switching field is higher for smaller magnetic elements, the current required to generate the external magnetic field increases dramatically for higher magnetic memory cell densities. Consequently, cross talk and power consumption may increase. The driving circuits used to drive the current that generates the switching field could also increase in area and complexity. Further, the conventional write currents have to be large enough to switch a magnetic memory cell but not so large that the neighboring cells are inadvertently switched. This upper limit on the write current amplitude can lead to reliability issues because some cells are harder to switch than others (due to fabrication and material nonuniformity) and may fail to write consistently. Moreover, a higher write current is more likely to damage one or more of the layers of the magnetic elements 10 and 10'.

Accordingly, what is needed is a system and method for providing a magnetic memory element which can be used in a memory array of high density, low power consumption, low cross talk, and high reliability, while providing sufficient readout signal. The present invention addresses the need for such a magnetic memory element.

SUMMARY OF THE INVENTION

The present invention provides a method and system for providing a magnetic element. In one aspect, the magnetic element includes at least a pinned layer, a free layer, and a current confined layer residing between the pinned layer and the free layer. The pinned layer is ferromagnetic and has a first magnetization. The current confined layer has at least one channel in an insulating matrix. The channel(s) are conductive and extend through the current confined layer. The free layer is ferromagnetic and has a second magnetization. The pinned layer, the free layer, and the current confined layer are configured to allow the magnetization of the free layer to be switched using spin transfer. The magnetic element may also include other layers, including layers for spin valve(s), spin tunneling junction(s), dual spin valve(s), dual spin tunneling junction(s), and dual spin valve/tunnel structure(s).

According to the system and method disclosed herein, the present invention provides a magnetic element that is capable of being written using the more efficient and localized spin-transfer switching while requiring a reduced current for writing. In addition, if more than one free layer is used, the free layers of structures can be separately tailored to improve the functions of the spin valve and spin tunneling junction, respectively.

DETAILED DESCRIPTION OF THE INVENTION

Figure 1A:
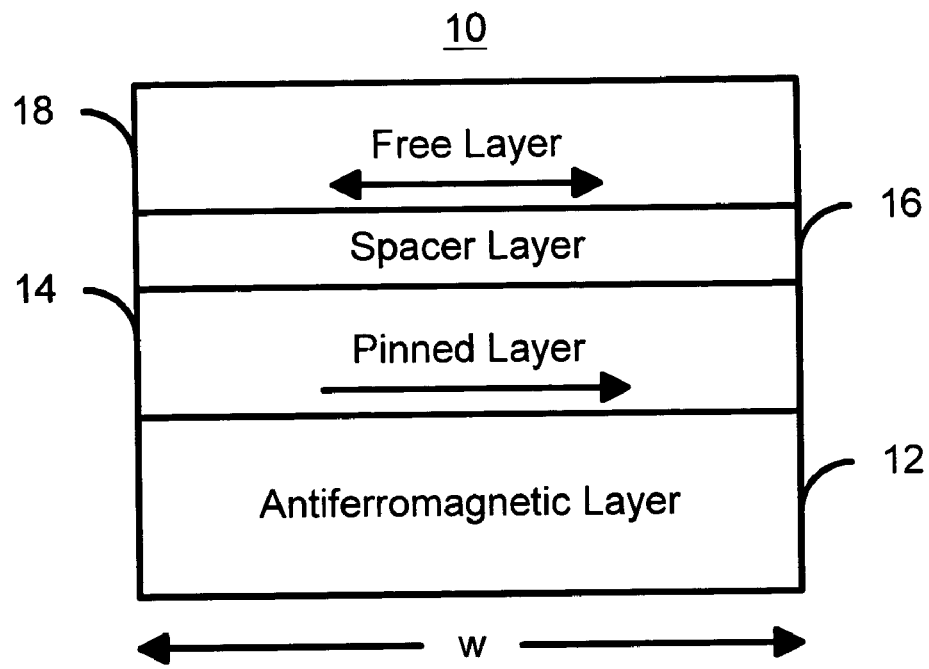
FIG. 1A is a diagram of a conventional magnetic element, a spin valve.
Figure 1B:
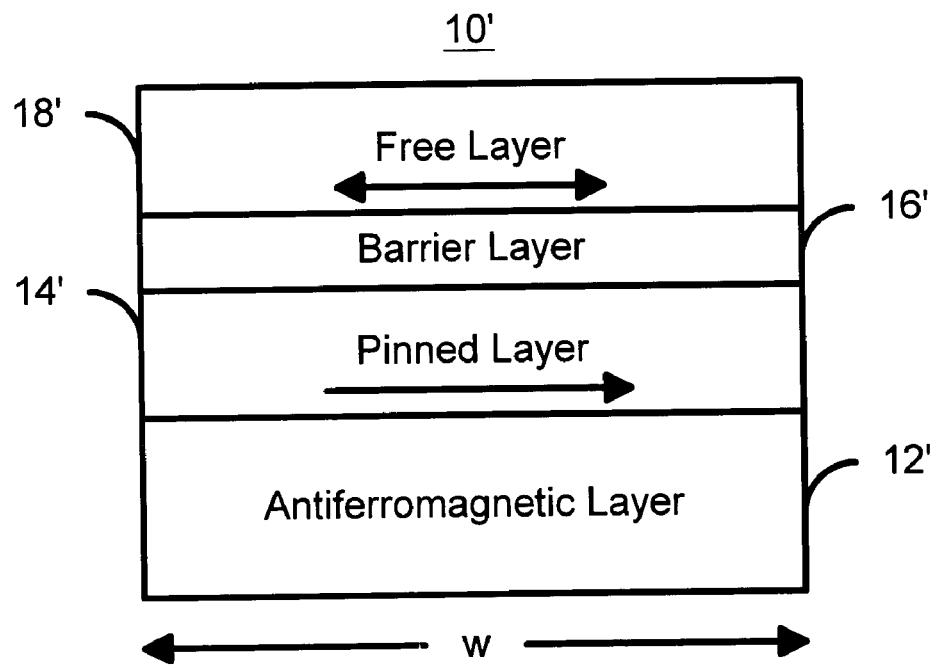
FIG. 1B is a diagram of another conventional magnetic element, a spin tunneling junction.

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

In order to overcome some of the issues associated with magnetic memories having a higher density of memory cells, spin transfer phenomenon may be utilized. Current knowledge of spin transfer is described in detail in J. C. Slonczewski, "Current-driven Excitation of Magnetic Multilayers," *Journal of Magnetism and Magnetic Materials*, vol. 159, p. L1–L5 (1996); L. Berger, "Emission of Spin Waves by a Magnetic Multilayer Traversed by a Current," *Phys. Rev. B*, Vol. 54, p. 9353 (1996), and in F. J. Albert, J. A. Katine and R. A. Buhman, "Spin-polarized Current Switching of a Co Thin Film Nanomagnet," *Appl. Phys. Lett.*, vol. 77, No. 23, p. 3809–3811 (2000). Thus, the following description of the spin transfer phenomenon is based upon current knowledge and is not intended to limit the scope of the invention.

When a spin-polarized current traverses a magnetic multilayer in a CPP configuration, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^7$–$10^8$ A/cm$^2$) and the dimensions of the multilayer are small (approximately less than two hundred nanometers). In addition, for spin transfer to be able to switch the magnetization direction of a ferromagnetic layer, the ferromagnetic layer should be sufficiently thin, for instance, preferably less than approximately five nanometers for Co.

The phenomenon of spin transfer can be used in the CPP configuration as an alternative to or in addition to using an external switching field to switch the direction of magnetization of the free layer 18 or 18' of the conventional spin valve 10 or the conventional spin tunneling junction 10', respectively. Spin transfer is a phenomenon which dominates other mechanisms and becomes observable when the dimensions of the conventional magnetic element 10/10' are small, in the range of few hundred nanometers. Consequently, spin transfer is suitable for higher density magnetic memories having smaller magnetic elements 10/10'.

For example, switching the magnetization of the conventional free layer 18 in the conventional spin valve 10 using spin transfer is described. The magnetization of the conventional free layer 18 is assumed to be initially antiparallel to the magnetization of the conventional pinned layer 14. When current is driven from the conventional free layer 8 to the conventional pinned layer 14, conduction electrons travel from the conventional pinned layer 14 to the conventional free layer 18. The majority electrons traveling from the conventional pinned layer 14 have their spins polarized in the same direction as the magnetization of the conventional pinned layer 14. These electrons interact with the magnetic moments of the conventional free layer 18 near the interface between the conventional free layer 18 and the conventional spacer layer 16. Thus, at least a portion of the electrons' spin angular momentum is transferred to the conventional free layer 18. If sufficient angular momentum is transferred, the magnetization of the conventional free layer 18 can be switched to be parallel to the magnetization of the conventional pinned layer 14.

Alternatively, the magnetization of the free layer 18 can be assumed to be initially parallel to the magnetization of the conventional pinned layer 14. When current is driven from the conventional pinned layer 4 to the conventional free layer 8, conduction electrons travel in the opposite direction. The majority electrons have their spins polarized in the direction of magnetization of the conventional free layer 8 and the conventional pinned layer. These majority electrons are, therefore, transmitted by the conventional pinned layer 4. However, the minority electrons are reflected from the conventional pinned layer 4. The reflected minority electrons interact with magnetic moments of the conventional free layer 8, transferring at least a portion of their spin angular momentum to the conventional free layer 8. If sufficient angular momentum is transferred, the magnetization of the free layer 8 can be switched to be antiparallel to the magnetization of the conventional pinned layer 4.

The present invention provides a method and system for providing a magnetic element. In one aspect, the magnetic element includes at least a pinned layer, a free layer, and a current confined layer residing between the pinned layer and the free layer. The pinned layer is ferromagnetic and has a first magnetization. The current confined layer has at least one channel in an insulating matrix. The channel(s) are conductive and extend through the current confined layer.

The free layer is ferromagnetic and has a second magnetization. The pinned layer, the free layer, and the current confined layer are configured to allow the magnetization of the free layer to be switched using spin transfer. The magnetic element may also include other layers, including layers for spin valve(s), spin tunneling junction(s), dual spin valve(s), dual spin tunneling junction(s), and dual spin valve/tunnel structure(s).

The present invention will be described in terms of a particular magnetic memory and a particular magnetic element having certain components. However, one of ordinary skill in the art will readily recognize that this method and system will operate effectively for other magnetic memory elements having different and/or additional components and other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of certain structures, such as spin valves, dual spin valves, spin tunneling junctions, and dual spin tunneling junctions. However, one of ordinary skill in the art will readily recognize that the present invention is not limited to such structures, but instead can be used in other structures not inconsistent with the present invention.

Figure 2:
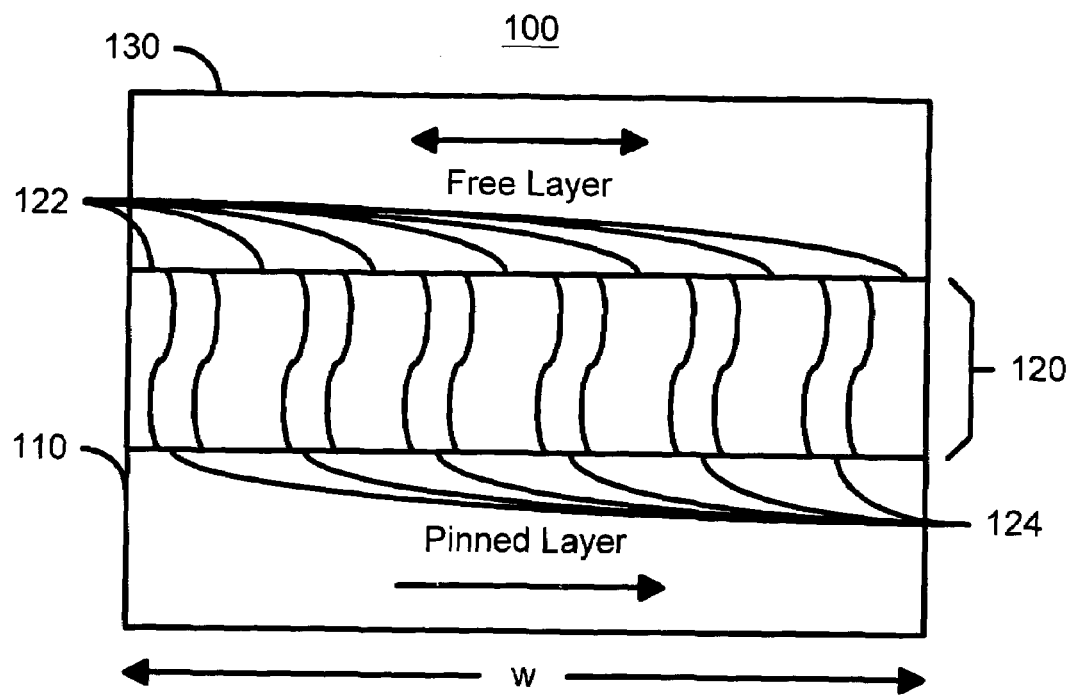
FIG. 2 is a diagram depicting one embodiment of a magnetic element having a current confined layer in accordance with the present invention.

To more particularly illustrate the method and system in accordance with the present invention, refer now to FIG. 2, depicting one embodiment of a magnetic element 100 having a current confined layer in accordance with the present invention. The magnetic element 100 is a spin valve. The magnetic element 100 thus includes a ferromagnetic pinned layer 110 and a ferromagnetic free layer 130. Although depicted as simple layers, the pinned layer 110 and free layer 130 may be synthetic. The pinned layer 110 is typically pinned using an AFM layer (not shown), but may be pinned in another manner. The magnetic element 100 also includes a current confined layer 120 residing between the pinned layer 110 and free layer 130. The current confined layer 120 includes nano-conductive channels 124 in an insulating matrix 122. The conductive channels 124 extend entirely through the thickness of the insulating matrix. The insulating matrix preferably includes insulating materials such as SiC and SiO. The conductive channels 124 preferably include materials such as Cu, CuAu, and Au. Also in a preferred embodiment, the conductive channels 124 have a diameter of approximately one to three nanometers.

In addition, the magnetic element 100 is preferably configured to allow spin transfer between the pinned layer 110 and the free layer 130 to write to (change the direction of magnetization of) the free layer 130. Consequently, the dimensions of the magnetic element 100 are small, in the range of few hundred nanometers. In a preferred embodiment, the dimensions of the magnetic element 100 are less than two hundred nanometers and preferably approximately one hundred nanometers. The magnetic element 100 preferably has a depth, perpendicular to the plane of the page in FIG. 2, of approximately fifty nanometers. The depth is preferably smaller than the width, w, of the magnetic element 100 so that the magnetic element 100 has some shape anisotropy, ensuring that the free layer 130 has a preferred direction. In addition, the thickness of the free layer 130 is small enough that the spin transfer is strong enough to rotate the free layer magnetization into and out of alignment with the magnetization of the pinned layer 110. In a preferred embodiment, the free layer 130 has a thickness of less than five nm.

Because of the use of the current confined layer 120, the current has a higher density in the areas of the channels 124. The localized high current density through the channels 124 allows for spin transfer to more readily take place in the region of the channels 124. The spin transfer can nucleate magnetic domains in the free layer 140 in the regions of the channels 124. These magnetizations of these domains are aligned by spin transfer and thus have the desired alignment. The entire magnetization of the free layer 130 can thus be switched to the desired direction by propagation of the domain walls in the free layer 130.

Because of the use of the current confined layer 120, a free layer 130 of a given size can be more easily switched using spin transfer. Consequently, a lower current can be used for a magnetic element 100 of a given size. Alternatively, a magnetic element 100 having larger lateral dimensions can be used with the same write current as a magnetic element having smaller lateral dimensions but without the current confined layer. Consequently, the manufacturing difficulties of patterning small spin transfer cells using the magnetic element 100 can be reduced and the production yield can be improved.

Figure 3:
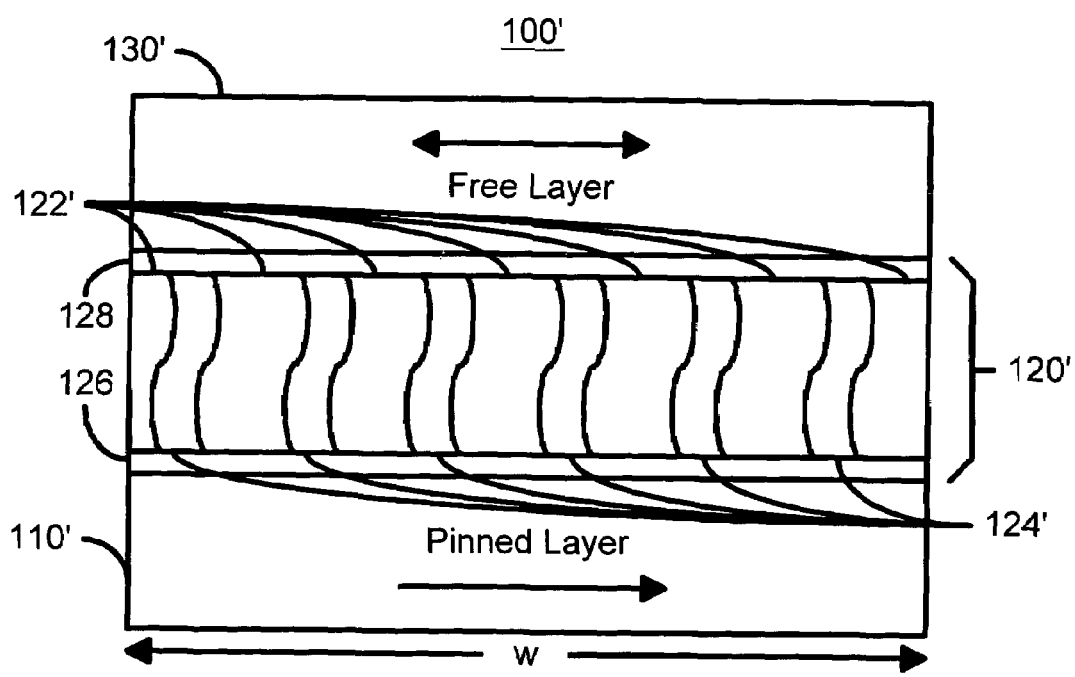
FIG. 3 is a diagram depicting a second embodiment of a magnetic element having a current confined layer in accordance with the present invention.

FIG. 3 is a diagram depicting a second embodiment of a magnetic element 100' having a current confined layer in accordance with the present invention. The magnetic element 100' has components which are analogous to of the magnetic element 100 those depicted in FIG. 2. Consequently, these elements are labeled similarly. The magnetic element 100' thus includes a ferromagnetic pinned layer 110', a ferromagnetic free layer 130', and a current confined layer 120' having conductive channels 124' in an insulating matrix 122'. Although depicted as simple layers, the pinned layer 110' and free layer 130' may be synthetic. In addition, the pinned layer 110' is preferably pinned using an AFM layer (not shown). The current confined layer 120' also includes conductive layers 126 and 128. The conductive layers 126 and 128 are preferably very thin, between five and ten Angstroms in thickness. The conductive layers 126 and 128 are nonmagnetic, for example Cu, AuCu, or Au. The conductive layers 126 and 128 reside between the ferromagnetic layers 120' and 130', respectively, and the insulating matrix 122'.

The magnetic element 100' works in substantially the same manner as the magnetic element 100. Because of the use of the current confined layer 120', the current has a higher density in the areas of the channels 124'. The spin transfer due to electrons traveling through the current confined layer 120' can nucleate magnetic domains in the free layer 140' in the regions of the channels 124'. These magnetizations of these domains are aligned by spin transfer and thus have the desired alignment. The entire magnetization of the free layer 130' can thus be switched to the desired direction by propagation of the domain walls through the free layer 130'. Because the current confined layer 120' allows the free layer 130' of a given size to be more easily switched using spin transfer, a lower current can be used for a magnetic element 100' of a given size. Alternatively, a magnetic element 100' having larger lateral dimensions can be used with the same write current as a magnetic element having a smaller lateral dimensions but without the current confined layer. The manufacturing difficulties of patterning small spin transfer cells using the magnetic element 100' can thus be reduced and the production yield can be improved.

Furthermore, the conductive layers 126 and 128 further improve the performance of the magnetic element 100'. The conductive layers 126 and 128 prevent the ferromagnetic layers 120' and 130' from being in direct contact with the insulating matrix 122'. As a result, the desired magnetic properties of the magnetic layers 110' and 120' are not altered by contact with the materials, such as oxide, in the insulating matrix 122'. Consequently, the magnetic element 100' can not only be used in a high-density memory, but also does not suffer performance degradation due to contact between the ferromagnetic layers 110' and 130' and the nonmagnetic matrix 122'.

Thus, the magnetic elements 100 and 100' allow for improved performance and higher density memories. The magnetic element 100 and/or 100' can also be incorporated into other magnetic elements. FIGS. 4–7B depict magnetic elements incorporating the magnetic element 100 and/or 100'. Thus, the elements depicted in FIGS. 4–7B enjoy some of the benefits of the CCL 120 and 120'. However, the magnetic element 100 and/or 100' could also be incorporated into other magnetic elements (not shown).

Figure 4:
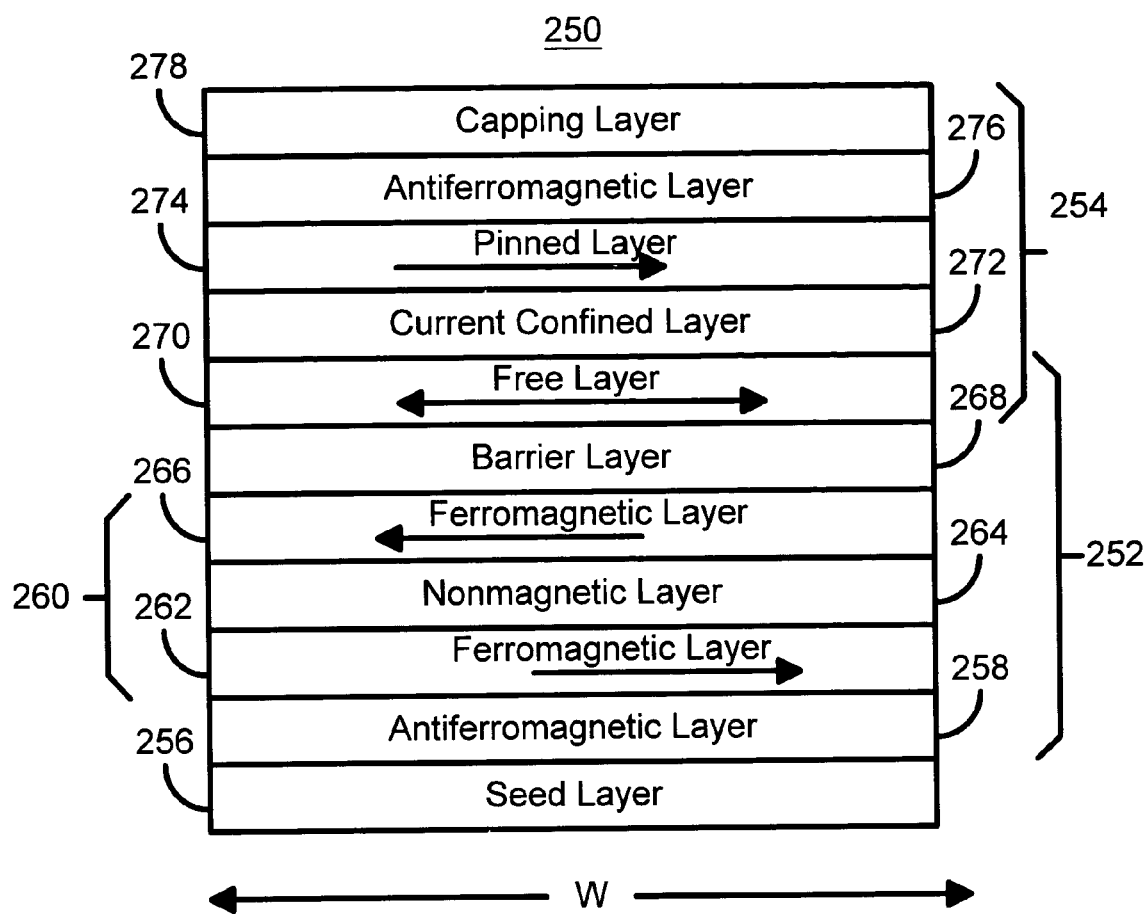
FIG. 4 is a diagram depicting an embodiment of a magnetic element having a current confined layer in accordance with the present invention that utilizes a spin valve in conjunction with a spin tunneling junction.

FIG. 4 is a diagram depicting an embodiment of a magnetic element 250 having a current confined layer in accordance with the present invention that utilizes a spin valve 254 in conjunction with a spin tunneling junction 252 that share a free layer 270. The magnetic element 250 thus includes a seed layer 256, an AFM layer 258, a pinned layer 260, an insulating barrier layer 268 (which may alternatively be a conducting spacer layer), a free layer 270, a CCL 272, another pinned layer 274, an AFM layer 276 and a capping layer 278. The seed layer 206 preferably includes materials such as Ta/NiFeCr or TaN/NiFeCr. The AFM layers 258 and 274 are preferably PtMn. The pinned layer 260 is preferably synthetic. Thus, the pinned layer 260 preferably includes two ferromagnetic (preferably Co or CoFe) layers 262 and 266 separated by a nonmagnetic (preferably Ru) layer 264. The barrier layer 268 is sufficiently thin to allow tunneling of charge carriers between the free layer 270 and the pinned layer 274. Thus, the spin tunneling junction 252 includes AFM layer 258, pinned layer 260, barrier layer 268, and free layer 270. The spin valve 254 includes the free layer 270, the CCL 272, the pinned layer 274, and the AFM layer 276. The CCL 272 includes at least conductive channels (not explicitly shown) in an insulating matrix (not explicitly shown). In addition, the CCL 272 also preferably includes conductive layers between the ferromagnetic layers 270 and 274 and the insulating matrix. Thus, the CCL 272 could be similar either to the CCL 120 or the CCL 120' depicted in FIGS. 2 and 3, respectively. The magnetic element 250 is also configured to be written using spin transfer. Thus, the dimensions of at least the spin valve 252 and the magnetic element 250 are similar to the magnetic elements 100 and 100' described above.

Referring back to FIG. 4, because the magnetic element 250 uses the CCL 272, spin transfer can nucleate magnetic domains in the free layer 270. The free layer 270 of a given size can be more easily switched using spin transfer. Consequently, a lower current can be used for a magnetic element 250 of a given size. Alternatively, a magnetic element 250 having a larger lateral dimensions size can be used in conjunction with the same write current. Consequently, the manufacturing difficulties of patterning small spin transfer cells using the magnetic element 250 can be reduced and the production yield can be improved. Furthermore, if the CCL 272 includes conductive layers to prevent ferromagnetic layers 270 and 274 from being in direct contact with the insulating matrix of the CCL 272, the desired magnetic properties of the ferromagnetic layers 270 and 274 are not altered by contact with the materials in the insulating matrix. Moreover, because the magnetic element 250 includes a spin tunneling junction 252, the resistance of the magnetic element 250 is greater. In particular, the resistance of the spin tunneling junction 252 dominates the read signal. Thus, the read signal from the magnetic element may be greater. Consequently, performance and/or density of the magnetic element 250 can be improved while preventing performance degradation due to contact between the ferromagnetic layers 270 and 274 and the nonmagnetic matrix of the CCL 272.

Figure 5A:
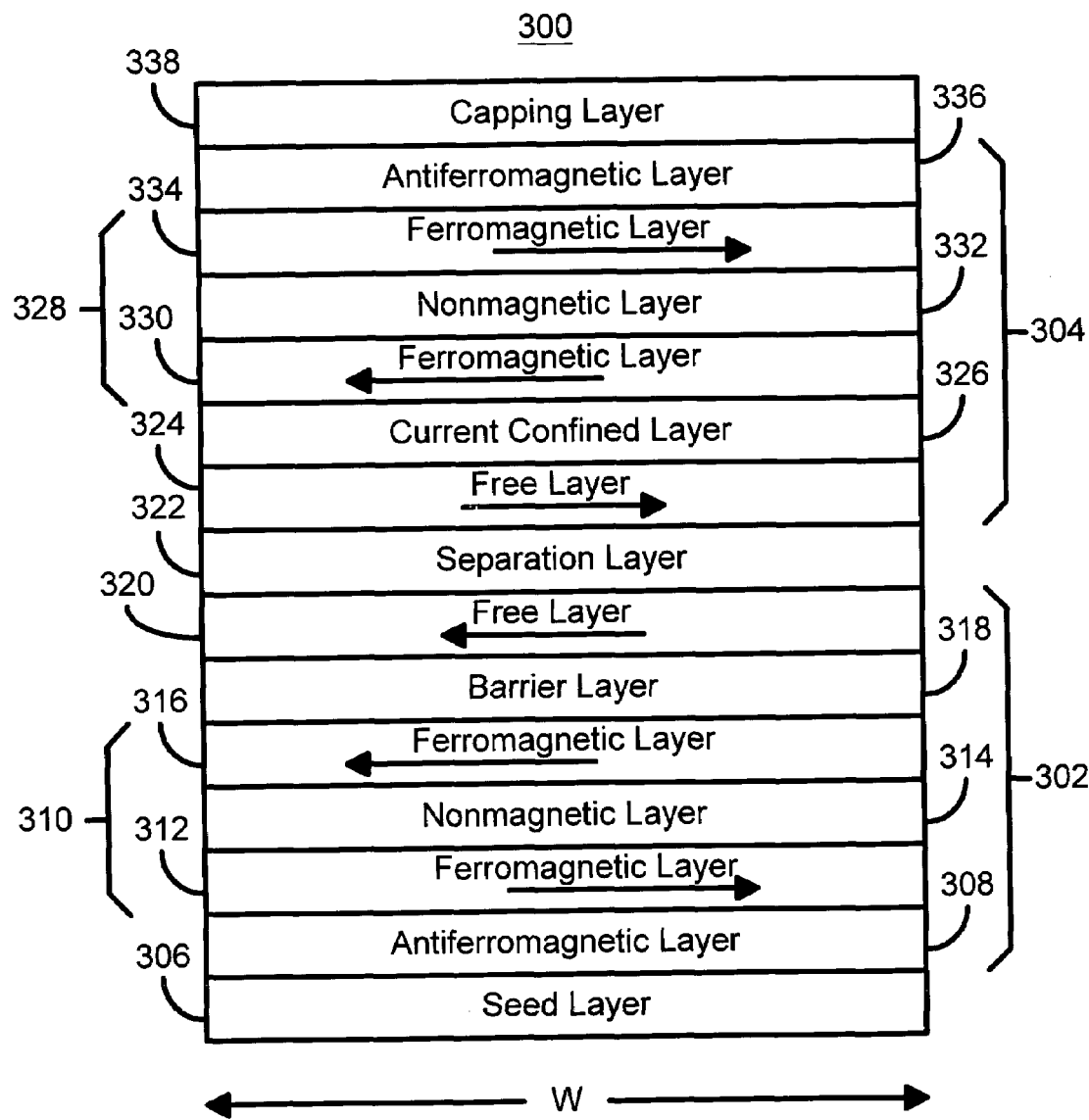
FIG. 5A is a diagram depicting another embodiment of a magnetic element having a current confined layer in accordance with the present invention that utilizes a spin valve in conjunction with a spin tunneling junction.

FIG. 5A is a diagram depicting another embodiment of a magnetic element 300 having a current confined layer in accordance with the present invention that utilizes a spin valve 304 in conjunction with a spin tunneling junction 302. The spin valve 304 is analogous to the spin valve 100 or 100' depicted in FIGS. 2 and 3, respectively. The magnetic element 300 thus includes a seed layer 306, an AFM layer 308, a pinned layer 310, an insulating barrier layer 318 (which may alternatively be a conducting spacer layer), a free layer 320, a separation layer 322, a second free layer 324, a CCL 326, another pinned layer 328, an AFM layer 336 and a capping layer 338. The seed layer 306 preferably includes materials such as Ta/NiFeCr or TaN/NiFeCr. The AFM layers 308 and 336 are preferably PtMn. The pinned layers 310 and 328 are preferably synthetic. Thus, the pinned layer 310 preferably includes two ferromagnetic (preferably Co or CoFe) layers 312 and 316 separated by a nonmagnetic (preferably Ru) layer 314. Similarly, the pinned layer 338 preferably includes two ferromagnetic (preferably Co or CoFe) layers 330 and 334 separated by a nonmagnetic (preferably Ru) layer 332. The barrier layer 318 is sufficiently thin to allow tunneling of charge carriers between the free layer 320 and the pinned layer 310. Thus, the spin tunneling junction 302 includes AFM layer 308, pinned layer 310, barrier layer 318, and free layer 320. The spin valve 304 includes the free layer 324, the CCL 326, the pinned layer 328, and the AFM layer 336. The CCL 326 includes at least conductive channels (not explicitly shown) in an insulating matrix (not explicitly shown). In addition, the CCL 326 also preferably includes conductive layers between the ferromagnetic layers 330 and 324 and the insulating matrix. Thus, the CCL 326 could be similar either to the CCL 120 or the CCL 120' depicted in FIGS. 2 and 3, respectively. The magnetic element 300 is also configured to be written using spin transfer. Thus, the dimensions of at least the spin valve 302 and the magnetic element 300 are similar to the magnetic elements 100 and 100' to described above.

Referring back to FIG. 5A, the separation layer 322 is a conductive, nonmagnetic layer that preferably includes Cu, CuPt, CuPtMn or Cu/Pt/Cu (or Cu/PtMn/Cu) sandwiches. The inserted Pt or PtMn thickness in the sandwich is about their spin diffusion length. The separation layer 322 has a thickness that is sufficiently short to ensure that the free layer 320 and the free layer 324 are magnetostatically coupled. Furthermore, the separation layer 322 is preferably configured such that the magnetizations of the free layer 320 and 324 are antiferromagnetically aligned as well as being magnetostatically coupled.

The free layer 324 of the spin valve 304 can be written using spin transfer. Because the free layers 320 and 324 are magnetostatically coupled writing of the spin valve 304 using spin transfer causes the magnetization of the free layer 320 of the spin tunneling junction 302 to have a specific orientation. Thus, any change in magnetization of the free layer 324 is reflected in the magnetization of the free layer 320. Furthermore, the spin tunneling junction 302 has a significantly larger resistance than the spin valve 304. The resistance of the spin tunneling junction 302 dominates the read signal. Thus, a large signal can be obtained using the spin tunneling junction 302 of the magnetic element 300.

Because the magnetic element 300 uses the CCL 326, spin transfer can nucleate magnetic domains in the free layer 324. The free layer 324 of a given size can be more easily switched using spin transfer. Consequently, a lower current can be used for a magnetic element 300 of a given size, or a magnetic element 300 having a larger lateral dimensions can be used in conjunction with the same write current. Consequently, the manufacturing difficulties of patterning small spin transfer cells using the magnetic element 300 can be reduced and the production yield can be improved. Furthermore, if the CCL 324 includes conductive layers to prevent ferromagnetic layers 330 and 324 from being in direct contact with the insulating matrix of the CCL 324, the desired magnetic properties of the ferromagnetic layers 330 and 324 are not altered by contact with the materials in the insulating matrix. Moreover, because the magnetic element 300 includes a spin tunneling junction 302 having a free layer 320 that is magnetostatically coupled with the free layer 324, the read signal from the magnetic element 300 may be greater. Consequently, performance and/or density of the magnetic element 300 can be improved while preventing performance degradation due to contact between the ferromagnetic layers 324 and 330 and the nonmagnetic matrix of the CCL 326.

Figure 5B:
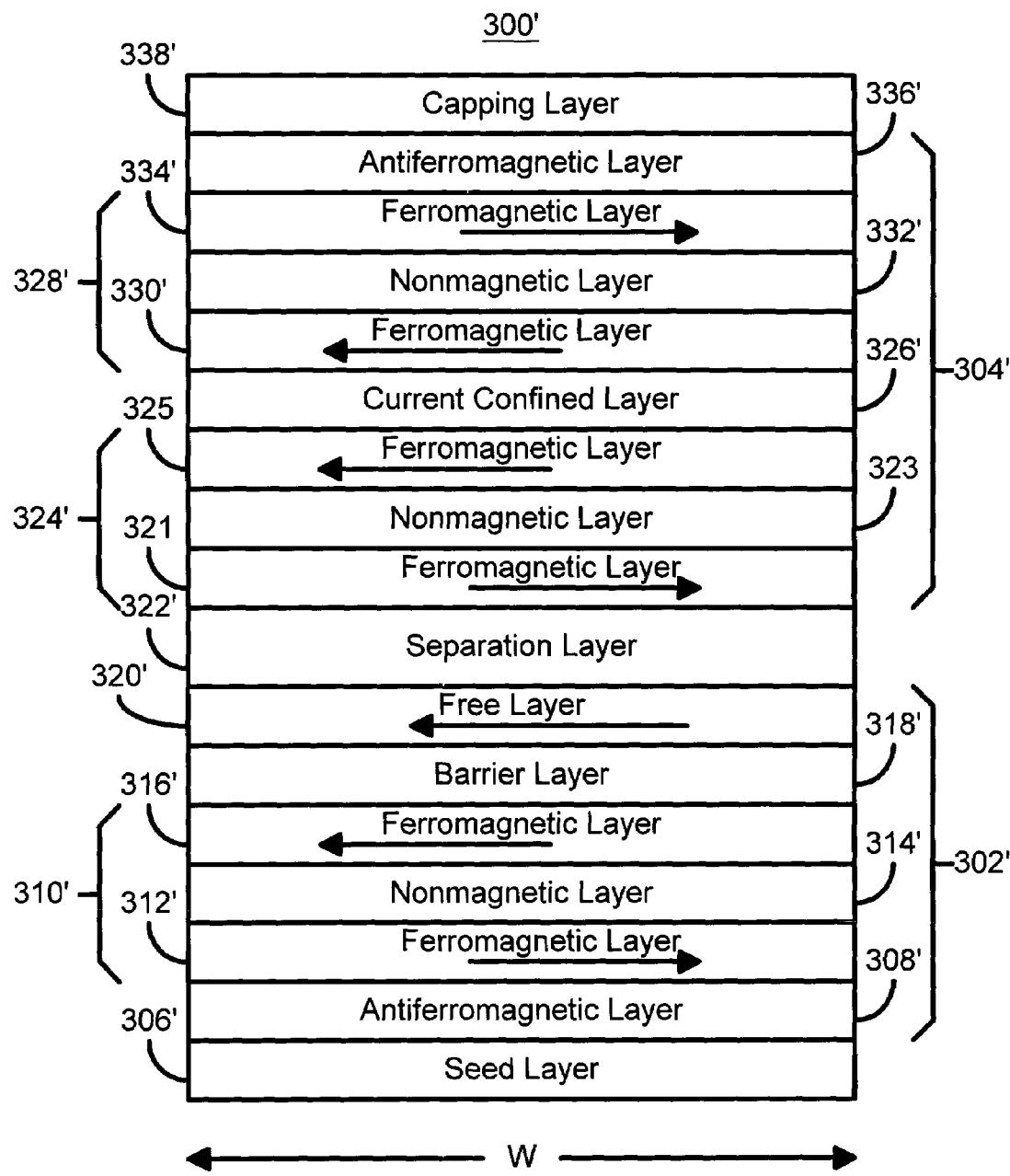
FIG. 5B is a diagram depicting another embodiment of a magnetic element having a current confined layer in accordance with the present invention that utilizes a spin valve in conjunction with a spin tunneling junction.

FIG. 5B is a diagram depicting another embodiment of a magnetic element 300' having a current confined layer in accordance with the present invention that utilizes a spin valve 304' in conjunction with a spin tunneling junction 302'. The magnetic element 300' has components which are analogous to those of the magnetic element 300 depicted in FIG. 6A. Consequently, these elements are labeled analogously. For example, the magnetic element 300' includes the spin tunneling junction 302' and spin valve 304'. In addition, the free layer 324' is synthetic. The free layer 324' thus includes ferromagnetic layers 321 and 325 separated by a nonmagnetic (preferably Ru) layer 323 such that the magnetizations of the ferromagnetic layers 321 and 325 are antiferromagnetically aligned. The magnetic element 300' is also configured to be written using spin transfer. Thus, the dimensions of at least the spin valve 302' the magnetic element 300' are similar to the magnetic elements 100 and 100' described above.

The magnetic element 300' shares the advantages of the magnetic element 300. Furthermore, because the free layer 324' is synthetic, both the spin valve 304' and the spin tunneling junction 302' contribute to the read signal. The layer 325 and the free layer 326' are aligned in the same direction. Thus, the change in resistance due to the alignment of the layer 325 with the layer 330' and the alignment of the free layer 320 with the layer 316' will be in the same direction (though different in magnitude). Stated differently, when the spin tunneling junction 302' is in a low resistance state, the spin valve 304' will also be in a low resistance state. When the spin tunneling junction 302' is in a high resistance state, the spin valve 304' will also be in a high resistance state. Thus, the magnetic element 300' may also have an improved signal.

Figure 6A:
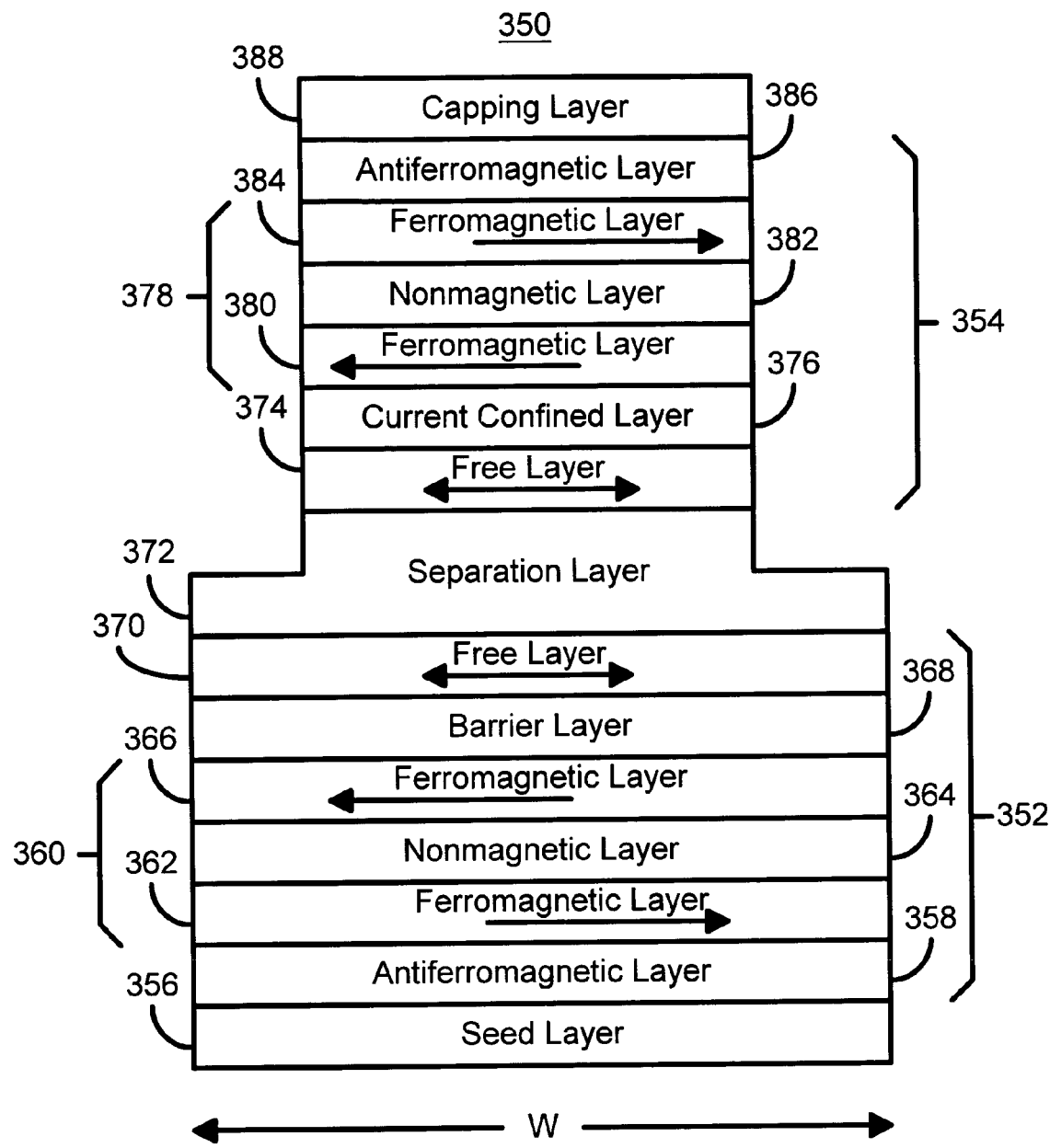
FIG. 6A is a diagram depicting one embodiment of a magnetic element having a current confined layer in accordance with the present invention that utilizes a spin valve in conjunction with a spin tunneling junction and is shaped with a reverse-T shape.

FIG. 6A is a diagram depicting one embodiment of a magnetic element 350 having a current confined layer in accordance with the present invention that utilizes a spin valve 352 in conjunction with a spin tunneling junction 354 and is shaped with a reverse-T shape. The spin valve 354 is analogous to the spin valve 100 or 100' depicted in FIGS. 2 and 3, respectively. The magnetic element 350 thus includes a seed layer 356, an AFM layer 358, a pinned layer 360, an insulating barrier layer 368 (which may alternatively be a conducting spacer layer), a free layer 370, a separation layer 372, a second free layer 374, a CCL 376, another pinned layer 378, an AFM layer 386 and a capping layer 388. The seed layer 356 preferably includes materials such as Ta/NiFeCr or TaN/NiFeCr. The AFM layers 358 and 386 are preferably PtMn. The pinned layers 360 and 378 are preferably synthetic. Thus, the pinned layer 360 preferably includes two ferromagnetic (preferably Co or CoFe) layers 362 and 366 separated by a nonmagnetic (preferably Ru) layer 364. Similarly, the pinned layer 378 preferably includes two ferromagnetic (preferably Co or CoFe) layers 380 and 384 separated by a nonmagnetic (preferably Ru) layer 382. The barrier layer 368 is sufficiently thin to allow tunneling of charge carriers between the free layer 370 and the pinned layer 360. Thus, the spin tunneling junction 352 includes AFM layer 358, pinned layer 360, barrier layer 368, and free layer 370. The spin valve 354 includes the free layer 374, the CCL 376, the pinned layer 378, and the AFM layer 386. The CCL 376 includes at least conductive channels (not explicitly shown) in an insulating matrix (not explicitly shown). In addition, the CCL 376 also preferably includes conductive layers between the ferromagnetic layers 380 and 374 and the insulating matrix. Thus, the CCL 376 could be similar either to the CCL 120 or the CCL 120' depicted in FIGS. 2 and 3, respectively. The magnetic element 350 is also configured to be written using spin transfer. Thus, the dimensions of at least the spin valve 352 and the magnetic element 350 are similar to the magnetic elements 100 and 100' described above.

Referring back to FIG. 6A, the separation layer 352 is a conductive, nonmagnetic layer that preferably includes Cu, CuPt, CuPtMn or Cu/Pt/Cu (or Cu/PtMn/Cu) sandwiches. The inserted Pt or PtMn thickness in the sandwich is about their spin diffusion length. The separation layer 352 has a thickness that is sufficient to ensure that the free layer 370 and the free layer 374 are magnetostatically coupled. Furthermore, the separation layer 372 is preferably configured such that the magnetizations of the free layer 370 and 374 are antiferromagnetically aligned as well as being magnetostatically coupled.

The free layer 374 of the spin valve 354 can be written using spin transfer. Because the free layers 370 and 374 are magnetostatically coupled writing of the spin valve 304 using spin transfer causes the magnetization of the free layer 370 of the spin tunneling junction 352 to have a specific orientation. Thus, any change in magnetization of the free layer 374 is reflected in the magnetization of the free layer 370. Furthermore, the spin tunneling junction 352 has a significantly larger resistance than he spin valve 354. The resistance of the spin tunneling junction 352 dominates the read signal. Thus, a large signal can be obtained using the spin tunneling junction 352 of the magnetic element.

Because the magnetic element 350 uses the CCL 356, the magnetic element 350 shares many of the same advantages as the magnetic element 300. Because of the CCL 356, spin transfer can nucleate magnetic domains in the free layer 374 and a lower switching current can be used for a magnetic element 350 of a given size. Alternatively, a larger magnetic element 350 with the CCL can be used with the same write current as that of a smaller magnetic element without the CCL. Consequently, the manufacturing difficulties of patterning small spin transfer cells using the magnetic element 350 can be reduced and the production yield can be improved. In addition, because the magnetic element 350 includes a spin tunneling junction 352 having a free layer 370 that is magnetostatically coupled with the free layer 374, the read signal from the magnetic element 350 may be greater. Moreover, the magnetic element 250 is shaped such that the width of the spin valve 354 is less than the width of the spin tunneling junction 354. Because the width of the spin valve 354 (particularly the free layer 374) is less, the current density through the free layer 374 is greater than the current density in the spin tunneling junction 352. Consequently, the current density required for spin transfer can be achieved in the spin valve 354 while having a reduced current density in the barrier layer and, therefore, a reduced possibility of damaging the barrier layer 368. In order to achieve this, the magnetic element 350 has a reverse-T shape such that the width of the spin valve 354 is less than that of the spin tunneling junction 352. In another embodiment, however, the magnetic element could have a different shape.

Figure 6B:
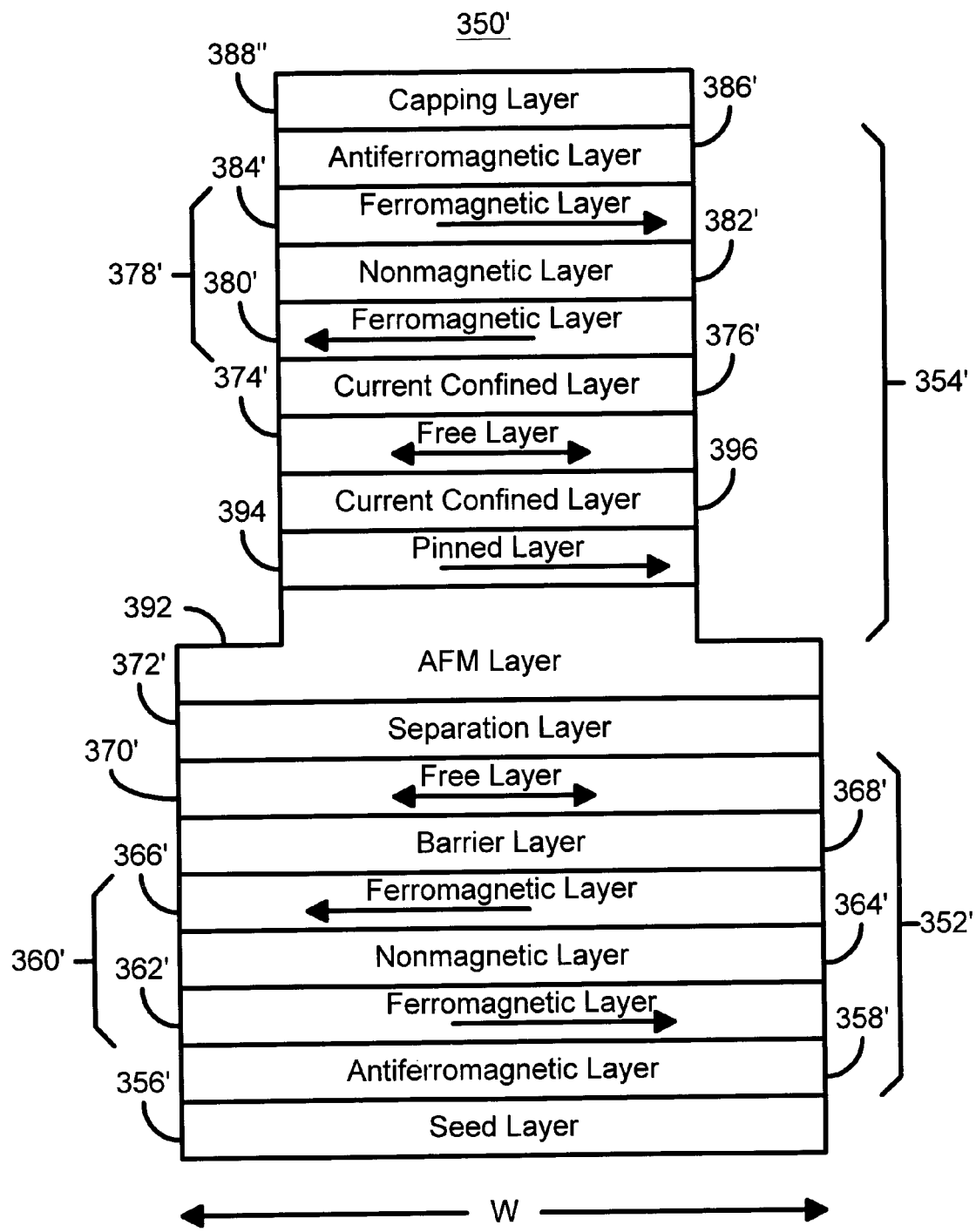
FIG. 6B is a diagram depicting one embodiment of a magnetic element having a current confined layer in accordance with the present invention that utilizes a dual spin valve in conjunction with a spin tunneling junction and is shaped.

FIG. 6B is a diagram depicting one embodiment of a magnetic element 350' having a current confined layer in accordance with the present invention that utilizes a dual spin valve in conjunction with a spin tunneling junction and is shaped. The magnetic element 350' has many of the same components as the magnetic element 350. Consequently, the magnetic element 350' includes a spin tunneling junction 352'. However, the magnetic element 350' also includes a dual spin valve 354'. The dual spin valve 354' includes AFM layer 392, another pinned layer 394, a nonmagnetic spacer layer 396 that is preferably a CCL, as well as the separation layer 372', the second free layer 374', the CCL 376', the pinned layer 378', and the AFM layer 386'. In addition, the magnetic element 350' is shaped. In a preferred embodiment, the layer 396 is a CCL so that the magnetization of the free layer 374' is more easily switched as described above. The magnetic element 350' is also configured to be written using spin transfer. Thus, the dimensions of at least the spin valve 352' the magnetic element 350' are similar to the magnetic elements 100 and 100' described above.

The magnetic element 350' shares the benefits of the magnetic element 350. In addition, because the magnetic element 350' includes a dual spin valve 354'', a lower write current can be used. Because of the use of a dual spin valve 354', the spin transfer phenomenon used to write to the free layer 374' employs electrons from both the ferromagnetic layer 380' and the pinned layer 394. For either current direction, transmitted majority electrons from one pinned layer 380' or 394 as well as the reflected minority electrons from the other pinned layer 394 or 380', respectively, exert a spin transfer torque on free layer 374'. Thus, a lower current can thus be used to write to the free layer 374'. Consequently, in addition to the benefits achieved by the magnetic element 350, the write current can be reduced for the magnetic element 350'.

Figure 7:
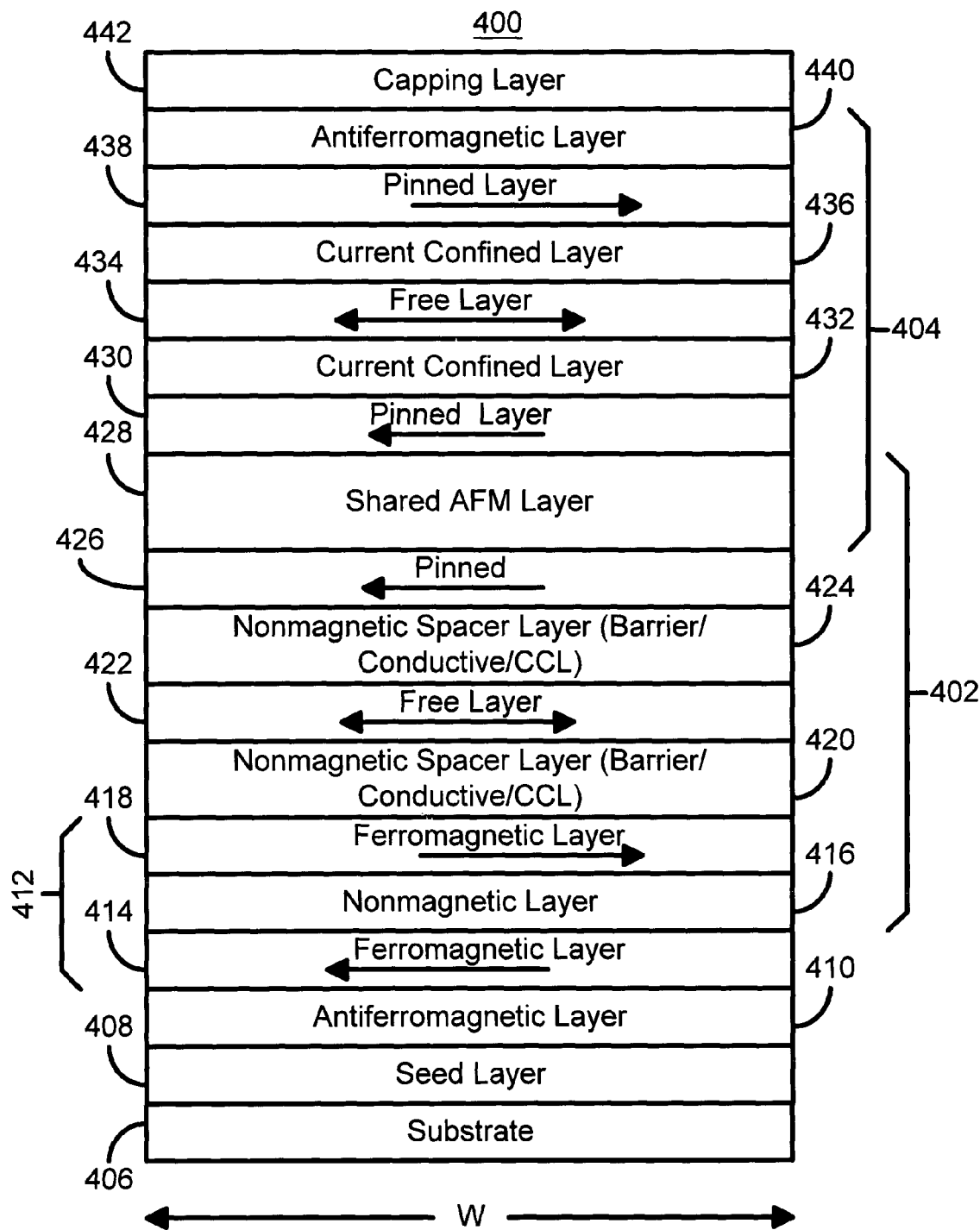
FIG. 7 is a diagram depicting one embodiment of a magnetic element having a current confined layer in accordance with the present invention that utilizes a dual spin valve in conjunction with a dual spin valve or dual spin tunneling junction.

FIG. 7 is a diagram depicting one embodiment of a magnetic element 400 having a current confined layer in accordance with the present invention that utilizes a dual spin valve 404 in conjunction with a junction 402 that may be either dual spin valve or dual spin tunneling junction. In a preferred embodiment, the junction 402 is a dual spin tunneling junction. The magnetic element 400 thus includes a seed layer 408 on a substrate 406, an AFM layer 410, a pinned layer 412, a nonmagnetic spacer layer 420, free layer 422, a second nonmagnetic spacer layer 424, a second pinned layer 426, an AFM layer 428, another pinned layer 430, a nonmagnetic spacer layer that is preferably a CCL 432, a free layer 434, another nonmagnetic spacer layer that is preferably a CCL 436, another pinned layer 438, an AFM layer 440 and a capping layer 442. Note that one or more of the pinned layers 412, 426, 430, and 438 could be synthetic. For example, the pinned layer 412 preferably includes ferromagnetic layers 414 and 418 separated by a nonmagnetic spacer layer 416 that is preferably Ru. Similarly, one or more of the free layers 422 and 434 could be synthetic. The preferred materials are those described above. For example, the AFM layers 410, 428, and 440 are preferably PtMn. Also in a preferred embodiment, the junction 402 and dual spin valve 404 share the AFM layer 428. The thickness of the AFM layer 428 and other layers 424, 426, 430 and 432 are such that the free layer 422 of the junction 402 is magnetostatically coupled with the free layer 434 of the dual spin valve 404. However, in an alternate embodiment, a separation layer (not shown) could be included such that the junction 402 and the dual spin valve 404 have separate AFM layers. The magnetic element 400 is also configured to be written using spin transfer. Thus, the dimensions of at least the spin valve 402 and the magnetic element 400 are similar to the magnetic elements 100 and 100' described above.

The nonmagnetic spacer layers 432 and 436 are preferably CCL. In a preferred embodiment, the nonmagnetic spacer layers 420 and 424 of the junction 402 are barrier layers. In such an embodiment, the junction 402 is a dual spin tunneling junction. In an alternate embodiment, the nonmagnetic spacer layers 420 and 424 are conductive and the junction 402 is a dual spin valve. In such a case, the nonmagnetic spacer layers 420 and 424 are preferably CCLs.

Because the magnetic element 400 uses CCLs for one or more of the layers 432 and 436, spin transfer can nucleate magnetic domains in the free layer 434. The free layer 434 of a given size can be more easily switched using spin transfer. Consequently, a lower current can be used for a magnetic element 400 of a given size or a magnetic element 400 having larger lateral dimensions can be used in conjunction with the same write current. Furthermore, if the CCLs 432 and 436 includes conductive layers to prevent adjacent ferromagnetic layers 430, 434, and 438 from being in direct contact with the insulating matrix of the CCL 324, the desired magnetic properties of the ferromagnetic layers 430, 434, and 438 are not altered by contact with the materials in the insulating matrix.

Because the magnetic element 400' includes the dual spin valve 404, a lower write current can be used. Because of the use of a dual spin valve 404, the spin transfer phenomenon used to write to the free layer 434 employs electrons from both the pinned layers 430 and 432, as for the magnetic element 350' depicted in FIG. 6B. Because the free layer 422 is magnetostatically coupled to the free layer 434, the junction 402 reflects the magnetization written to the dual spin valve 404 even if the junction 402 is not directly written to using spin transfer. For example, if the junction 402 is a spin tunneling junction, the current density used to write to the dual spin valve 404 may not write to the junction 402. However, because of the magnetostatic coupling, the orientation of the magnetization of the free layer 422 reflects that of the free layer 434. Furthermore, if the junction 402 is a dual spin tunneling junction, the read signal from the magnetic element 400 may be greater. Consequently, performance and/or density of the magnetic element 400 can be improved. Thus, using the magnetic elements 100, 100', 250, 300, 300', 350, 350' and 400 using CCL layers, performance can be improved and a higher density memory achieved. Moreover, the manufacturing difficulties of patterning small spin transfer cells using the magnetic elements 100, 100', 250, 300, 300', 350, 350' and 400 can be reduced and the production yield can be improved.

Figure 8:
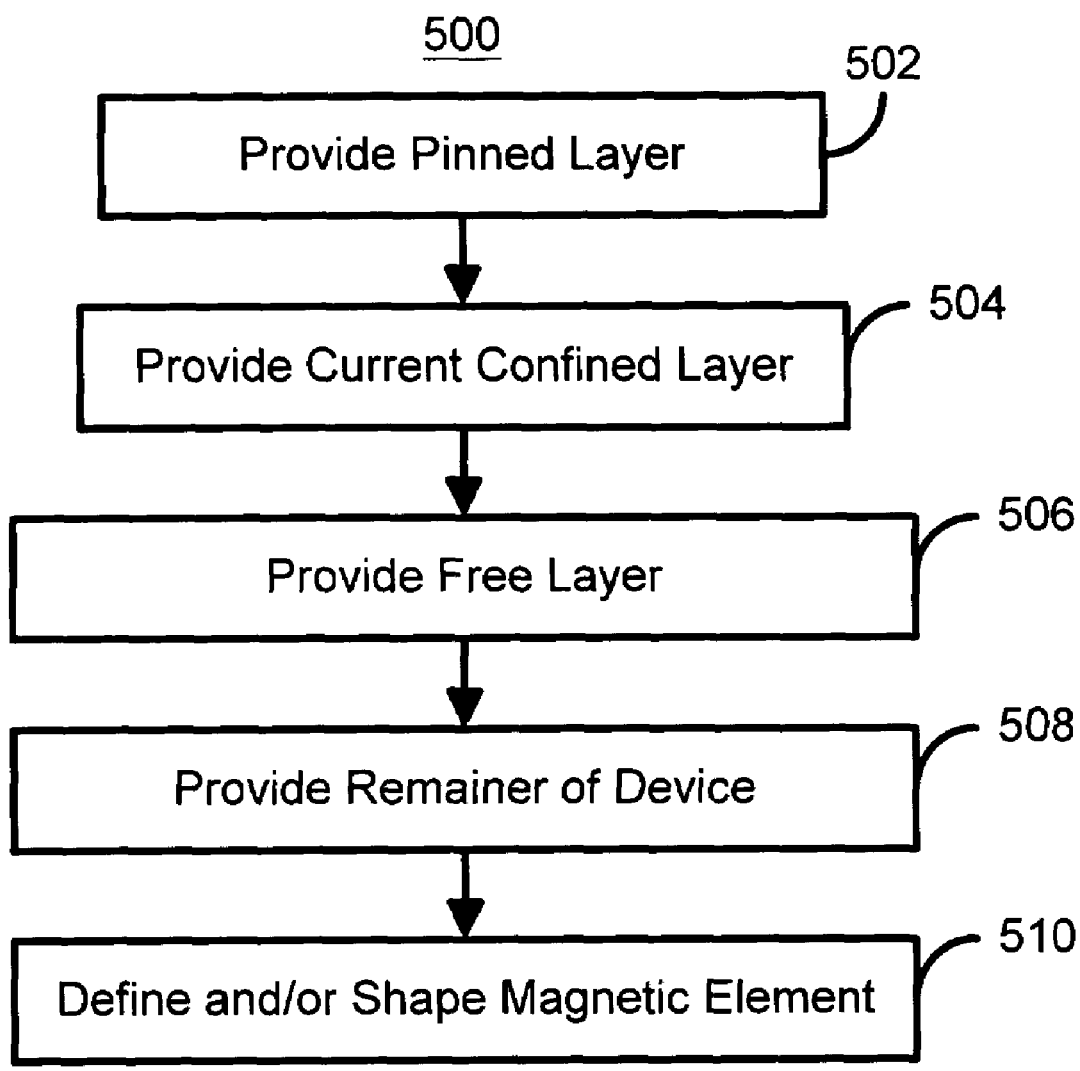
FIG. 8 is a high-level flow chart depicting one embodiment of a method in accordance with the present invention for providing a magnetic element having a current confined layer.

FIG. 8 is a high-level flow chart depicting one embodiment of a method 500 in accordance with the present invention for providing a magnetic element having a CCL. The method 500 is described in conjunction with the magnetic element 100'. However, one of ordinary skill in the art will readily recognize that the method 500 could be used to fabricate portions of other embodiments described above.

A pinned layer 110' is provided, via step 502. In a preferred embodiment, the pinned layer 110' is provided on an AFM layer. A CCL layer having conductive channel(s) 124' in an insulating matrix 122' is provided, via step 504. In one embodiment, step 504 includes providing conductive layers, such as the conductive layers 126 and 128. In such an embodiment, the layer 126 is provided in step 504 such that the insulating matrix 122' does not contact the pinned layer 110'. In one embodiment, a dry self-assembly approach using techniques such as ion beam bombardment, cluster deposition or thermal deposition may be used to provide the conductive channels 124' in the insulating matrix 122' in step 504. A free layer 130' is provided such that the CCL 120' resides between the free layer 130' and the pinned layer 110', via step 506. In addition, the free layer 130' and CCL 120' are provided in steps 506 and 508 such that the free layer 130' does not directly contact the insulating matrix 122'. Any remaining layers in the device may then be provided, via step 508. For example, a capping layer and/or other layers of a dual spin valve may be provided in step 508. The magnetic element 100' may then be defined and/or shaped, via step 510. For example, if the method 500 is used to provide the magnetic element 350, the magnetic element is shaped such that the spin tunneling junction 352 has a larger with than the spin valve 354. Thus, using the method 500, a magnetic element including one or more CCLs may be provided and the benefits described above achieved.

Figure 9A:
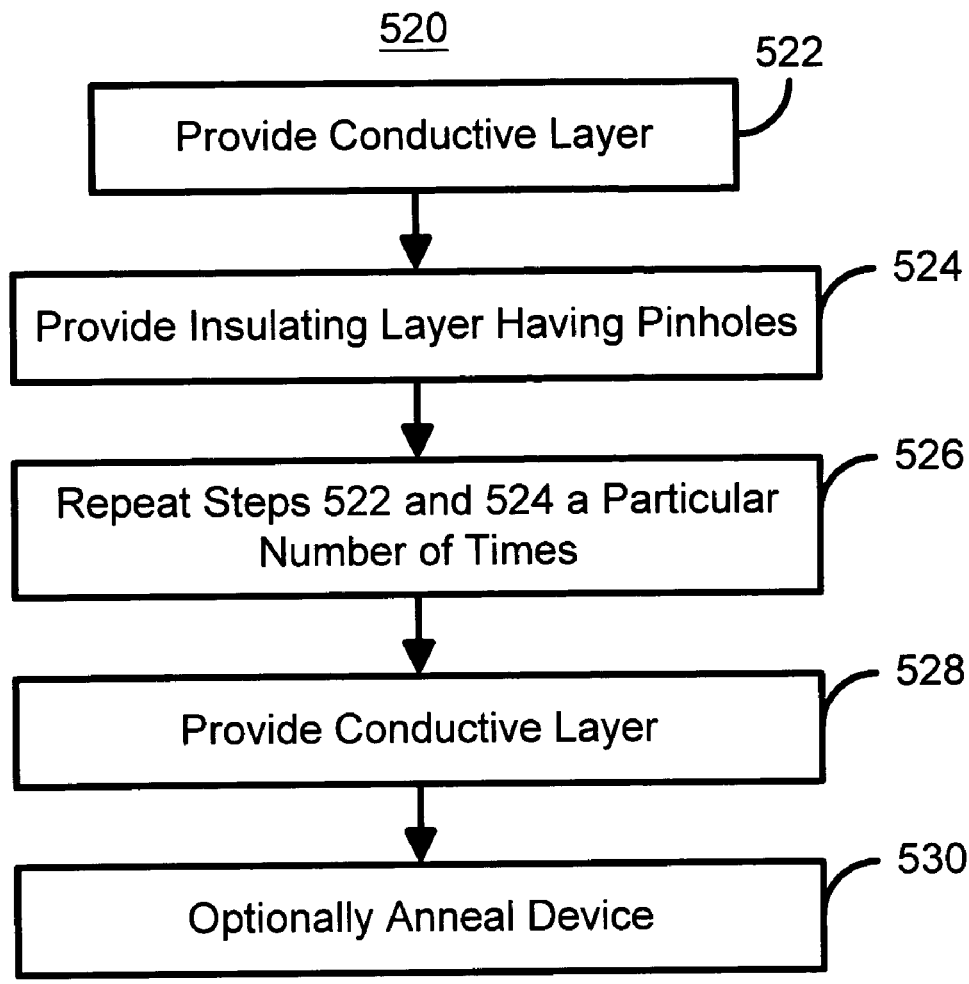
FIG. 9A is a high-level flow chart depicting one embodiment of a method for providing a current confined layer.

FIG. 9A is a high-level flow chart depicting one embodiment of a method 520 for providing a CCL, such as the CCL 120 or 120'. The method 520 may thus be used to perform the step 504 of the method 500. For clarity, the method 520 is described in the context of the CCL 120'. However, nothing prevents the use of the method 520 in forming another CCL. However, for the CCL 120' steps 522 and 528 may be omitted.

Referring back to FIG. 9A, a conductive layer 126 is provided, via step 522. An insulating layer is provided on the conductive layer 126 preferably by sputtering, via step 524. The insulating layer can be $Al_2O_3$, $Hf_2O_3$, $CoFeO_x$, or $CoFeBO_x$. The insulating layer can be formed by first depositing a thin metal layer such as Al, Hf, CoFe, CoFeB, followed by natural or plasma oxidation of the thin metal layer. The insulating layer provided in step 524 includes pinholes therein. The size and density of the pinholes may be controlled by controlling the deposition conditions used in step 524 as well as the thickness of the insulating layer provided. Optionally, steps 522 and 524 can be repeated the desired number of times, via step 526. Each time a conductive layer is added when step 522 is repeated, the pinholes in the underlying insulating layer are at least partially filled. By repeating step 522 and 524, the conductive channels (conductor in the pin holes) and insulating matrix are built. A final conductive layer, which preferably fills remaining pinholes and provides the layer 128, is provided, via step 528. The magnetic element is annealed, via step 530 to stabilize the conductive channels formed in the insulating matrix. Thus, a CCL 120' can be provided and the benefits described above achieved.

Figure 9B:
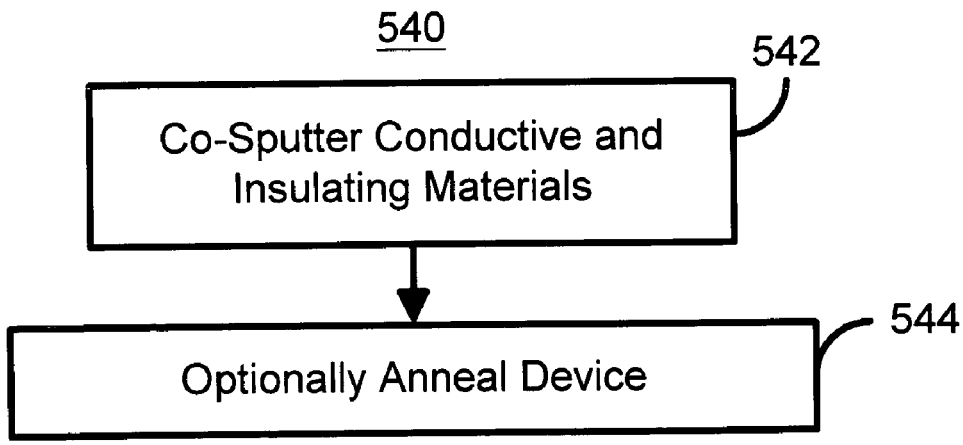
FIG. 9B is a high-level flow chart depicting a second embodiment of a method for providing a current confined layer.

FIG. 9B is a high-level flow chart depicting a second embodiment of a method 540 for providing a CCL, such as the CCL 120 or 120'. The method 540 may thus be used to perform the step 504 of the method 500. For clarity, the method 540 is described in the context of the CCL 120. However, nothing prevents the use of the method 540 in forming another CCL. The conductive materials used for the conductive channels 124 are co-deposited (e.g., co-sputtered) with the insulating materials used in forming the insulating matrix 122, via step 542. For example, materials such as Cu, CuAu, or Au may be co-deposited (e.g., co-sputtered) with materials such as SiC and SiO. These conductive materials are not mixable with such insulating materials in an equilibrium state. The density and dimensions of the conductive channels 124 may be controlled by adjusting the deposition rates for the conductive and insulating materials. The CCL is optionally annealed, via step 544. The anneal may further segregate the SiC (or silicon oxide) and Cu (or CuAu, Au) phase and stabilize the conductive channels 124 in the insulating matrix 122.

Figure 10:
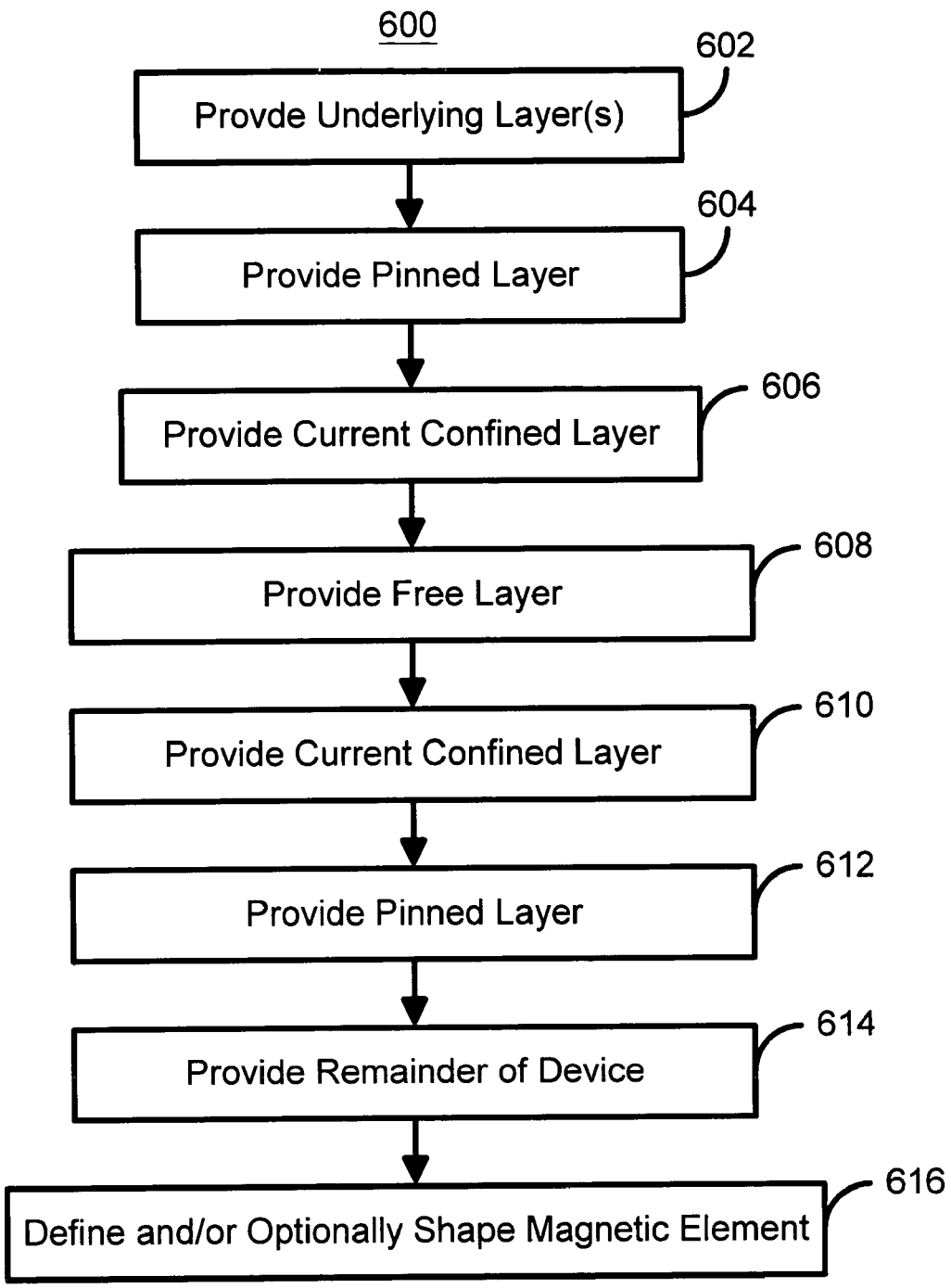
FIG. 10 is a flow chart depicting one embodiment of a method in accordance with the present invention for providing a magnetic element having a current confined layer.

FIG. 10 is a flow chart depicting one embodiment of a method 600 in accordance with the present invention for providing a magnetic element having a current confined layer. The method 600 is described in the context of the magnetic element 350'. However, nothing prevents the use of the method 600 with another magnetic element.

The underlying layers in the magnetic element are provided, via step 602. For example, the layers of the spin tunneling junction 352', the separation layer 372', and AFM layer 394 are provided in step 602. The pinned layer 394 is provided, via step 604. The CCL 396 is provided, via step 606. The method 520, 540, or a dry-self assembly might be used in step 606. The free layer 374 is provided, via step 608. Another CCL 376' is provided, via step 610. The method 520, 540, or a dry-self assembly might be used in step 610. Another pinned layer 378' is provided, via step 612. In a preferred embodiment, step 612 forms a synthetic pinned layer 378'. The remaining layers of the device are provided, via step 614. For example, the AFM layer 386' and capping layer 388' may be provided in step 614. The magnetic element may be defined and optionally shaped such that the dual spin valve is smaller in width than the spin tunneling junction 352', via step 616. Consequently, the magnetic element may be formed.

A method and system has been disclosed for providing a magnetic element utilizing at least one CCL. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
   a pinned layer, the pinned layer being ferromagnetic and having a first magnetization;
   a current confined layer having at least one channel in an insulating matrix, the at least one channel being conductive and extending through the current confined layer; and
   a free layer, the free layer being ferromagnetic and having a second magnetization, the current confined layer residing between the pinned layer and the free layer and being adjacent to the pinned layer and the free layer;
   wherein the pinned layer, the free layer, and the current confined layer are configured to allow the second magnetization of the free layer to be switched using spin transfer.

2. The magnetic element of claim 1 wherein the at least one channel has a diameter of between one and three nanometers.

3. The magnetic element of claim 1 wherein the magnetic element further includes:
   a second pinned layer being ferromagnetic and having a third magnetization;
   a nonmagnetic spacer layer residing between the free layer and the second pinned layer.

4. The magnetic element of claim 3 wherein the nonmagnetic spacer layer includes a second current confined layer.

5. The magnetic element of claim 3 wherein the nonmagnetic spacer layer includes a barrier layer, the barrier layer being insulating and having a thickness that allows tunneling of current carriers between the free layer and the second pinned layer.

6. The magnetic element of claim 3 wherein the nonmagnetic spacer layer includes a conducting layer.

7. The magnetic element of claim 1 wherein the free layer is a synthetic free layer including a first ferromagnetic layer and a second ferromagnetic layer separated by a nonmagnetic layer.

8. A magnetic element comprising:
   a pinned layer, the pinned layer being ferromagnetic and having a first magnetization;
   a current confined layer having at least one channel in an insulating matrix, the at least one channel being conductive and extending through the current confined layer; and
   a free layer, the free layer being ferromagnetic and having a second magnetization, the current confined layer residing between the pinned layer and the free layer;
   wherein the pinned layer, the free layer, and the current confined layer are configured to allow the second magnetization of the free layer to be switched using spin transfer;
   a first conductive layer disposed between the free layer and the current confined layer; and
   a second conductive layer disposed between the pinned layer and the current confined layer.

9. A magnetic element comprising:
   a first pinned layer, the first pinned layer being ferromagnetic and having a first magnetization;
   a current confined layer having at least one channel in an insulating matrix, the at least one channel being conductive and extending through the current confined layer; and
   a first free layer, the first free layer being ferromagnetic and having a second magnetization, the current confined layer residing between the first pinned layer and the first free layer; and
   a spin tunneling junction having a second free layer, a second pinned layer and a barrier layer residing between the second free layer and the second pinned layer, the barrier layer being insulating and having a thickness that allows tunneling of current carriers between the second free layer and the second pinned layer, the second free layer and the first free layer being magnetostatically coupled;
   wherein the first pinned layer, the first free layer, and the current confined layer are configured to allow the second magnetization of the first free layer to be switched using spin transfer.

10. The magnetic element of claim 9 wherein the at least one channel has a diameter of between one and three nanometers.

11. The magnetic element of claim 9 further comprising:
    a separation layer between the first free layer and the second free layer, the separation layer insuring that the first free layer and the second free layer are magnetostatically coupled.

12. The magnetic element of claim 9 wherein the spin tunneling junction is a dual spin tunneling junction having a third pinned layer and a second barrier layer residing between the third pinned layer and the second free layer, the third pinned layer being ferromagnetic.

13. The magnetic element of claim 12 further comprising:
    a fourth pinned layer; and
    a nonmagnetic spacer layer, the nonmagnetic spacer layer residing between the first free layer and the fourth pinned layer, the second free layer and the first free layer being spaced apart such that the first free layer and the second free layer are antiferromagnetically coupled.

14. The magnetic element of claim 9 wherein the magnetic element is shaped such that the first free layer has a first width and the second free layer has a second width, the second width being greater than the first width.

15. The magnetic element of claim 9 wherein the current confined layer further includes:
    a first conductive layer disposed between the first free layer and the current confined layer; and
    a second conductive layer disposed between the first pinned layer and the current confined layer.

16. A magnetic element comprising:
    a first pinned layer, the first pinned layer being ferromagnetic and having a first magnetization;
    a current confined layer having at least one channel in an insulating matrix, the at least one channel being conductive and extending through the current confined layer; and
    a first free layer, the first free layer being ferromagnetic and having a second magnetization, the current confined layer residing between the first pinned layer and the free layer; and
    a spin valve having a second free layer, a second pinned layer and a nonmagnetic spacer layer residing between the second free layer and the second pinned layer;
    wherein the first pinned layer, the first free layer, and the current confined layer are configured to allow the second magnetization of the first free layer to be switched using spin transfer.

17. The magnetic element of claim 16 wherein the nonmagnetic spacer layer is a second current confined layer having at least a second channel in a second insulating matrix, the at least the second channel being conductive and extending through the second current confined layer.

18. The magnetic element of claim 16 further comprising:

a separation layer between the first free layer and the second free layer, the separation layer for insuring that the first free layer and the second free layer are magnetostatically coupled.

19. The magnetic element of claim 16 wherein the spin valve is a dual spin valve having a third pinned layer and a second nonmagnetic spacer layer residing between the third pinned layer and the second free layer, the third pinned layer being ferromagnetic.

20. The magnetic element of claim 19 further comprising:
a fourth pinned layer; and
a second nonmagnetic spacer layer, the second nonmagnetic spacer layer residing between the first free layer and the fourth pinned layer, the second free layer and the first free layer being spaced apart such that the first free layer and the second free layer are antiferromagnetically coupled.

21. The magnetic element of claim 20 wherein the second nonmagnetic spacer layer includes a second current confined layer having at least a second channel in a second insulating matrix, the at least the second channel being conductive and extending through the second current confined layer.

22. The magnetic element of claim 20 wherein the current confined layer further includes:
a first conductive layer disposed between the first free layer and the current confined layer; and
a second conductive layer disposed between the first pinned layer and the current confined layer.

23. The magnetic element of claim 16 wherein the at least one channel has a diameter of between one and three nanometers.

24. A magnetic element comprising:
a first pinned layer, the first pinned layer being ferromagnetic and having a first magnetization;
a current confined layer having at least one channel in an insulating matrix, the at least one channel being conductive and extending through the current confined layer; and
a first free layer, the first free layer being ferromagnetic and having a second magnetization, the current confined layer residing between the first pinned layer and the first free layer; and
a dual spin valve/tunnel structure having a second pinned layer, a nonmagnetic spacer layer, a second free layer, a third pinned layer and a barrier layer residing between the second free layer and the third pinned layer, the barrier layer being insulating and having a thickness that allows tunneling of current carriers between the second free layer and the second pinned layer, the nonmagnetic spacer residing between the second pinned layer and the second free layer, the second free layer and the first free layer being magnetostatically coupled;
wherein the first pinned layer, the first free layer, and the current confined layer are configured to allow the second magnetization of the free layer to be switched using spin transfer.

25. The magnetic element of claim 24 further comprising:
a separation layer between the first free layer and the second free layer, the separation layer for insuring that the first free layer and the second free layer are magnetostatically coupled.

26. The magnetic element of claim 25 further comprising:
a fourth pinned layer; and
a second nonmagnetic spacer layer, the second nonmagnetic spacer layer residing between the first free layer and the fourth pinned layer, the second free layer and the first free layer being spaced apart such that the first free layer and the second free layer are antiferromagnetically coupled.

27. The magnetic element of claim 26 wherein the second nonmagnetic spacer layer includes a second current confined layer having at least a second channel in a second insulating matrix, the at least the second channel being conductive and extending through the second current confined layer.

28. The magnetic element of claim 24 wherein the nonmagnetic spacer layer is a second current confined layer including at least a second channel in a second insulating matrix, the at least the second channel being conductive and passing through the second current confined layer.

29. The magnetic element of claim 24 wherein the current confined layer further includes:
a first conductive layer disposed between the first free layer and the current confined layer; and
a second conductive layer disposed between the first pinned layer and the current confined layer.

30. The magnetic element of claim 24 wherein the at least one channel has a diameter of between one and three nanometers.

31. The magnetic element of claim 1 wherein the lateral dimension of the free layer is not more than two hundred nanometers.

32. The magnetic element of claim 31 wherein the lateral dimension of the free layer is not more than one hundred nanometers.

33. The magnetic element of claim 1 wherein the free layer has a thickness of five nanometers.

34. The magnetic element of claim 1 wherein the free layer has a depth of fifty nanometers.

* * * * *